US009797556B2

(12) United States Patent
Pirruccio et al.

(10) Patent No.: US 9,797,556 B2
(45) Date of Patent: Oct. 24, 2017

(54) PHOSPHOR BASED LIGHTING DEVICES AND METHOD OF GENERATING A LIGHT OUTPUT

(71) Applicant: PHILIPS LIGHTING HOLDING B.V., Eindhoven (NL)

(72) Inventors: Giuseppe Pirruccio, Eindhoven (NL); Jaime Gomez Rivas, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 14/897,894

(22) PCT Filed: Oct. 21, 2014

(86) PCT No.: PCT/EP2014/072470
§ 371 (c)(1),
(2) Date: Dec. 11, 2015

(87) PCT Pub. No.: WO2015/062894
PCT Pub. Date: May 7, 2015

(65) Prior Publication Data
US 2016/0305620 A1   Oct. 20, 2016

(30) Foreign Application Priority Data
Oct. 29, 2013   (EP) ..................................... 13190693

(51) Int. Cl.
*F21K 2/00*   (2006.01)
*F21K 9/64*   (2016.01)
*H01L 33/50*  (2010.01)
*H01S 5/00*   (2006.01)

(52) U.S. Cl.
CPC .............. *F21K 9/64* (2016.08); *H01L 33/502* (2013.01); *H01L 33/505* (2013.01); *H01S 5/005* (2013.01)

(58) Field of Classification Search
CPC ......... F21K 9/64; G02F 1/0126; H01L 33/505
See application file for complete search history.

(56) References Cited

U.S. PATENT DOCUMENTS 7,157,839 B2   1/2007   Ouderkirk et al.
2004/0150997 A1   8/2004   Ouderkirk et al.
(Continued)

FOREIGN PATENT DOCUMENTS

CN   101416322 A   4/2009
CN   103031124 A   4/2013
(Continued)

OTHER PUBLICATIONS

Chong, Y.D., et al., "Coherent Perfect Absorbers: Time-Reversed Lasers," Physical Review Letters, 105, 053901 (2010), (4 pages).
(Continued)

*Primary Examiner* — Sean Gramling
*Assistant Examiner* — Gerald J Sufleta, II

(57) ABSTRACT

The invention provides a lighting device having a photo-excited phosphor layer, with two monochromatic light beams (1, 1a, 1b) that counter propagate within the phosphor layer (2) thereby providing a destructive interference of the excitation light outside the phosphor layer (2). The excitation light source has an output wavelength greater than a peak absorption wavelength of the phosphor. This enables more efficient conversion of light and reduced heating.

15 Claims, 5 Drawing Sheets

(56) References Cited

U.S. PATENT DOCUMENTS

| | | | |
|---|---|---|---|
| 2008/0113183 A1* | 5/2008 | Kitai | H05B 33/10 |
| | | | 428/332 |
| 2012/0134002 A1 | 5/2012 | Stone | |
| 2015/0049377 A1* | 2/2015 | Zheludev | G02F 1/0126 |
| | | | 359/244 |
| 2016/0131967 A1* | 5/2016 | Saitou | G03B 21/204 |
| | | | 353/31 |

FOREIGN PATENT DOCUMENTS

| | | |
|---|---|---|
| WO | 2010006275 A1 | 1/2010 |
| WO | 2012158256 A1 | 11/2012 |
| WO | 2013041979 A1 | 3/2013 |

OTHER PUBLICATIONS

Kao, T.S., et al., "Coherent Control of Nanoscale Light Localization in Metamaterial: Creating and Positioning Isolated Subwavelength Energy Hot Spots," Physical Review Letters, 106, 085501 (2011) (4 pages).

Wan, Wenjie, et al., "Time-Reversed Lasing and Interferometric Control of Absorption," Science, 331, 889 (2011) (5 pages).

Yoon, Jaewoong, et al., "Critical coupling in dissipative surface-plasmon resonators with multiple ports," Optics Express, vol. 18, No. 25 (2010) (10 pages).

Yoon, Jae Woong, et al., "Measusrement and Modeling of a Complete Optical Absorption and Scattering by Coherent Surface Plasmon-Polariton Excitation Using a Silver Thin-Film Grating," Physical Review Letters, 109, 257402 (2012) (5 pages).

\* cited by examiner

PHOSPHOR BASED LIGHTING DEVICES AND METHOD OF GENERATING A LIGHT OUTPUT

CROSS-REFERENCE TO PRIOR APPLICATIONS

This application is the U.S. National Phase application under 35 U.S.C. §371 of International Application No. PCT/EP2014/072470, filed on Oct. 21, 2014, which claims the benefit of European Patent Application No. EP 13190693.5, filed on Oct. 29, 2013. These applications are hereby incorporated by reference herein.

FIELD OF THE INVENTION

This invention relates to phosphor based lighting devices in which a phosphor is photo-excited by a light source to emit light of a different wavelength.

BACKGROUND OF THE INVENTION

Phosphor based lighting devices are known. For example, a light source emits light of a first wavelength(s) which is used to photo excite a luminescent phosphor layer, which then generates light of a different (desired) wavelength(s).

In such devices, a solid state pump source (e.g. a laser diode) can be used as a source of monochromatic light for the system. This source light is used to pump a conversion phosphor that absorbs the pump light and re-emits light at one or more desired wavelengths. The light emitted by the phosphor typically has improved luminous efficacy compared to that emitted by the pump source. By varying the monochromatic source and the phosphor, a range of emitted wavelengths can be achieved as an output of such a device.

Semiconductors typically used in the pump source include GaAs, InP, GaSb and GaN. Commonly used phosphors are garnet pellets such as Yttrium Aluminium Garnet ("YAG"), but also quantum dots such as CdSe/CdS or InP and organic dyes are employed.

Phosphors are found in applications such as white light emitting diodes (LEDs) and full down-conversion based devices. The latter is considered and proved to be very promising for the production of high-color-purity light, especially in wavelength ranges in which direct radiation from non-converted LEDs is relatively inefficient, i.e. in the so-called "yellow gap". Typically, amber LEDs are used in automobile applications or in traffic signals and are believed to be promising for illumination of photolithography rooms.

By way of example, Ce3+ doped yttrium aluminum garnet, $Y_3Al_5O_{12}$ (YAG:Ce), is an important phosphor for lighting applications because of its superb luminescent properties, chemical durability, and thermal stability. It has an absorption peak around 460 nm while its emission spectrum spans the range 500-750 nm.

It is generally desirable to maximize the absorption of light by the phosphor in order to generate as much converted light as possible. One direct way of enhancing the absorption is to increase the amount of Ce3+ in the YAG crystal. However if the concentration is higher than a threshold (typically >5 mol %), the YAG:Ce starts to exhibit concentration quenching, resulting in a reduced quantum efficiency and decreased emission intensity. For a fixed percentage of doping, total absorption is prevented by the amount of reflected and transmitted pump light which escapes the phosphor layer.

To limit the amount of light escaping after transmission through a YAG:Ce pellet it is in general convenient to pump the phosphor at the wavelength of its absorption peak and use a long pass filter in order to reflect and recycle the unabsorbed pump light. However this introduces a natural loss, known as quantum deficit, in the efficiency of the device, which is associated with the Stokes shift characteristic of the phosphor. The quantum deficit is defined as the difference between the excitation wavelength and the maximum emission wavelength. The Stokes' shift characteristic of the phosphor represents the difference in wavelength (or energy difference) between absorption and emission at the phosphor (based on the wavelength at which the imaginary component of the refractive index of the medium is maximum).

This quantum deficit is generally considered unavoidable. The quantum deficit is important because it appears in the formula for the power efficiency of the phosphor-converted LED, where it is quantified through the ratio of the excitation wavelength to the centroid of the emission spectrum.

In prior art lighting devices the intensity of the photo luminescence is dictated only by the intensity of the incident light from the pump light source. In order to achieve efficient absorption of the pump light, the thickness of the phosphor needs to be comparable to its absorption length.

For commonly used phosphors, like yttrium aluminum garnet, the thickness of material required for sufficient absorption of the pump source is in the order of several tens of microns. To minimize this thickness, the phosphor is pumped at the wavelength at which its absorption coefficient is at a maximum and the quantum deficit is also large. The quantum deficit represents a limit to the efficiency of such a device and causes the heating of the phosphor. Upon overheating (the temperature of the phosphor may exceed 300° C.), the efficiency of the phosphor drops significantly and results in additional power loss and uncontrolled further heating which may damage the lighting device.

US2004/0150997A1 discloses a LED with a phosphor layer that receives excitation light. The phosphor layer emits visible light when illuminated with the excitation light. A polymeric multilayer optical film enhances the efficiency of the LED by reflecting light that would otherwise be wasted back onto the phosphor layer.

SUMMARY OF THE INVENTION

The invention is defined by the accompanying claims.

According to the invention, there is provided a lighting device comprising:

a phosphor layer; and a light source arrangement arranged to pump or photo excite the phosphor layer wherein the light source arrangement is configured to provide two monochromatic light beams that counter propagate within the phosphor layer thereby providing destructive interference of the light outside the phosphor layer, wherein the phosphor layer has an absorption spectrum with respect to wavelength having a peak absorption at a first wavelength, and wherein the light source has a peak output of a second wavelength larger than the first wavelength.

This device makes use of destructive interference outside the phosphor layer, to enable a longer wavelength excitation light source to be used. This reduces the wavelength difference between excitation and emission and thereby reduces the adverse effect of the quantum deficit, so as to reduce heating of the phosphor layer and increase the efficiency of the device.

In embodiments, the material of the phosphor layer, the thickness of the phosphor layer and the excitation wavelength are selected to achieve full absorption of the output of the light source arrangement. This means the phosphor is operated for coherent perfect absorption (CPA). The invention thus makes use of CPA for phosphor based lighting systems. The light source arrangement provides a monochromatic light beam, although a light beam having a narrow linewidth around a desired wavelength is also acceptable.

By adopting this principle, the thickness of the phosphor can be reduced by for example up to a hundred microns without compromising the output, even for weakly absorbing phosphors, thereby enabling the manufacture of smaller, less expensive, yet more efficient lighting devices of this sort.

In contrast to prior art devices, the wavelength of the excitation source can be selected to be one at which the phosphor is poorly absorbing. In particular, the selected wavelength is red-shifted with respect to the wavelength of maximum absorption of the phosphor.

The thickness of the phosphor layer is preferably selected to achieve perfect absorption of the output of the light source arrangement. The invention essentially then makes use of the coherent perfect absorption ("CPA") process within a phosphor-based lighting device.

In a first arrangement, the light source arrangement generates first and second beams of equal intensity and wavelength, and the light source arrangement is configured to direct the first and second beams to counter propagate within the phosphor layer.

Through adjustment of the phase difference for these two counter propagating beams, for a given angular and spectral window, destructive interference can be created outside the phosphor causing the incident light to be substantially entirely dissipated by the phosphor.

The phosphor can therefore be made to convert substantially all of the absorbed incident light from the light source arrangement into photoluminescence. This provides an efficient lighting device, with increased power efficiency and reduced heating.

The configuration of the light source arrangement can be for directing the first and second beams normally into the phosphor layer from opposite sides of the phosphor layer. This provides the desired counter propagation. The beams can instead be introduced at an angle to the phosphor layer.

The device can comprise a positioning device for adjusting the path length (i.e. phase) of one of the counter propagating beams with respect to the other thereby to control the phase of the one of the counter propagating beams. By manipulating the phase relation of the multiple coherent beams impinging on the phosphor it is possible to control the amount of pumped light dissipated by the phosphor and therefore the amount of photoluminescence produced.

The positioning device can be a piezo-stage or a spatial light modulator.

In an alternative arrangement, the light source arrangement generates a single beam, and the device comprises a dichroic mirror at an opposite side of the phosphor layer to the side into which the single beam is introduced.

This arrangement provides destructive interference between the reflected part of the incident excitation beam at the first phosphor interface and the reflection of that beam on the dichroic mirror. The dichroic mirror is preferably for reflecting light of the wavelength of the output of the light source arrangement, i.e. the pump light.

A second dichroic mirror can also be provided at the side of the phosphor layer into which the single beam is introduced, the second dichroic mirror being for reflecting light of the wavelength of the light output of the phosphor layer. This second reflector is used to prevent converted light from escaping from one surface of the lighting device.

A tuner can be provided for adjusting the wavelength of the light source and a controller can be used for controlling the angle of incidence of the light source output into the phosphor layer.

By varying the wavelength of the light source over a range, maximum absorption by the phosphor can be achieved. The tuner is thus operable to control the intensity of the photoluminescence.

A suitable phosphor for use in a lighting device in accordance with the invention is a YAG, more particularly CeYAG doped at 3.3%. A specific example of such a phosphor is available under the brand name Lumiramic™ and marketed by Philips Lumileds Lighting Company.

The invention also provides a method for generating a light output, comprising:
  generating a light output;
  introducing the light output into a phosphor layer to pump or photo excite the phosphor layer; and
  providing destructive interference of the light output outside the phosphor layer,
  wherein the phosphor layer has an absorption spectrum with respect to wavelength having a peak absorption at a first wavelength, and the light source arrangement output has a peak output of a wavelength greater than the first wavelength.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides a lighting device having a photo-excited phosphor layer, with a destructive interference of the excitation light outside the phosphor layer. The excitation light source has an output wavelength larger than a peak absorption wavelength of the phosphor. This enables a smaller difference between the excitation and emission wavelengths, so that the heating effect normally resulting from the quantum deficit is reduced.

Figure 1:
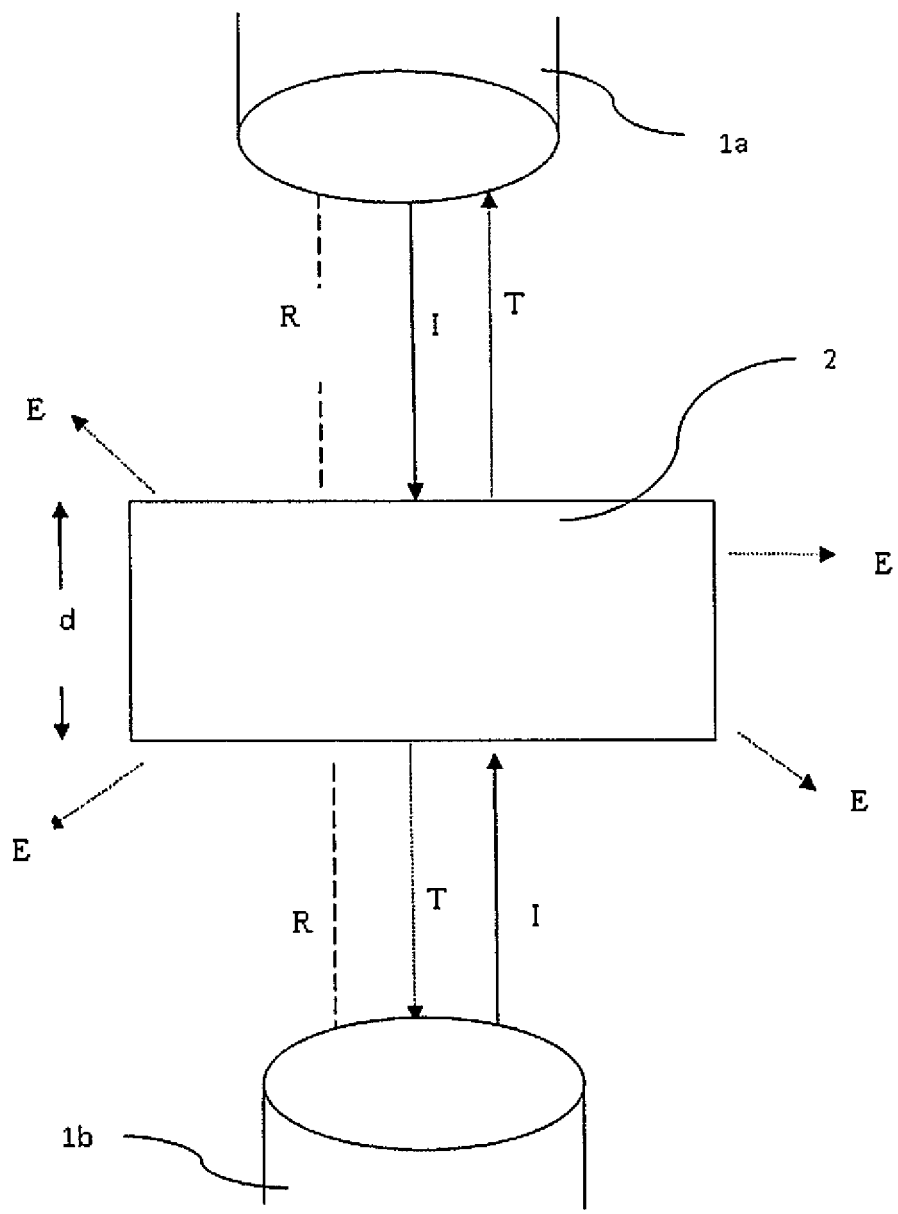
FIG. 1 illustrates the illumination scheme of a first embodiment of a lighting device in accordance with the invention.

FIG. 1 shows a first example of lighting device of the invention.

In FIG. 1 a pair of monochromatic light beams 1a, 1b, for example from a laser diode, are arranged to provide excitation light in the form of first and second overlapping co-linear (i.e. collimated and parallel) and counter propagating beams I of equal intensity at normal incidence on two opposing surfaces of a thin slab of phosphor 2, having a thickness d. They can originate from the same source, with a beam splitter and reflector arrangement to provide the two beams.

Each of the beams I is partially reflected R and partially transmitted and absorbed by the phosphor. After absorption, the phosphor emits light E of different wavelength to the incident light.

By adjusting the phase of the 2 counterpropagating beams, destructive interference occurs between the reflected part R of the first of the source beams and a transmitted part T of the second of the source beams, improving absorption by the phosphor 2.

Oblique illumination by the two light sources is also possible instead of the normal illumination shown.

This approach uses a double beam illumination to control the total absorption of the incident light by the phosphor. The intensity of the two beams is set to be the same, and the phase of one of them is controlled externally for example by a piezo electrical actuator, with nanometer precision motion, or an analogous device.

This phase control enables the absorption of the incident light to be tuned between 100% and a minimum dictated by the refractive index contrast at the interface of the phosphor.

A destructive interference pattern can be created outside of the slab where the reflected part R of the first beam interferes with the transmitted part T of the second beam.

The thickness of the layer and the wavelength of the excitation light are tuned for a given phosphor to achieve perfect or near coherent perfect absorption. An advantage is that the wavelength can be chosen to be one at which the phosphor is poorly absorbing. This wavelength can be red-shifted with respect to the wavelength of maximum absorption of the phosphor, which leads to a reduced quantum deficit in the emission.

Figure 2:
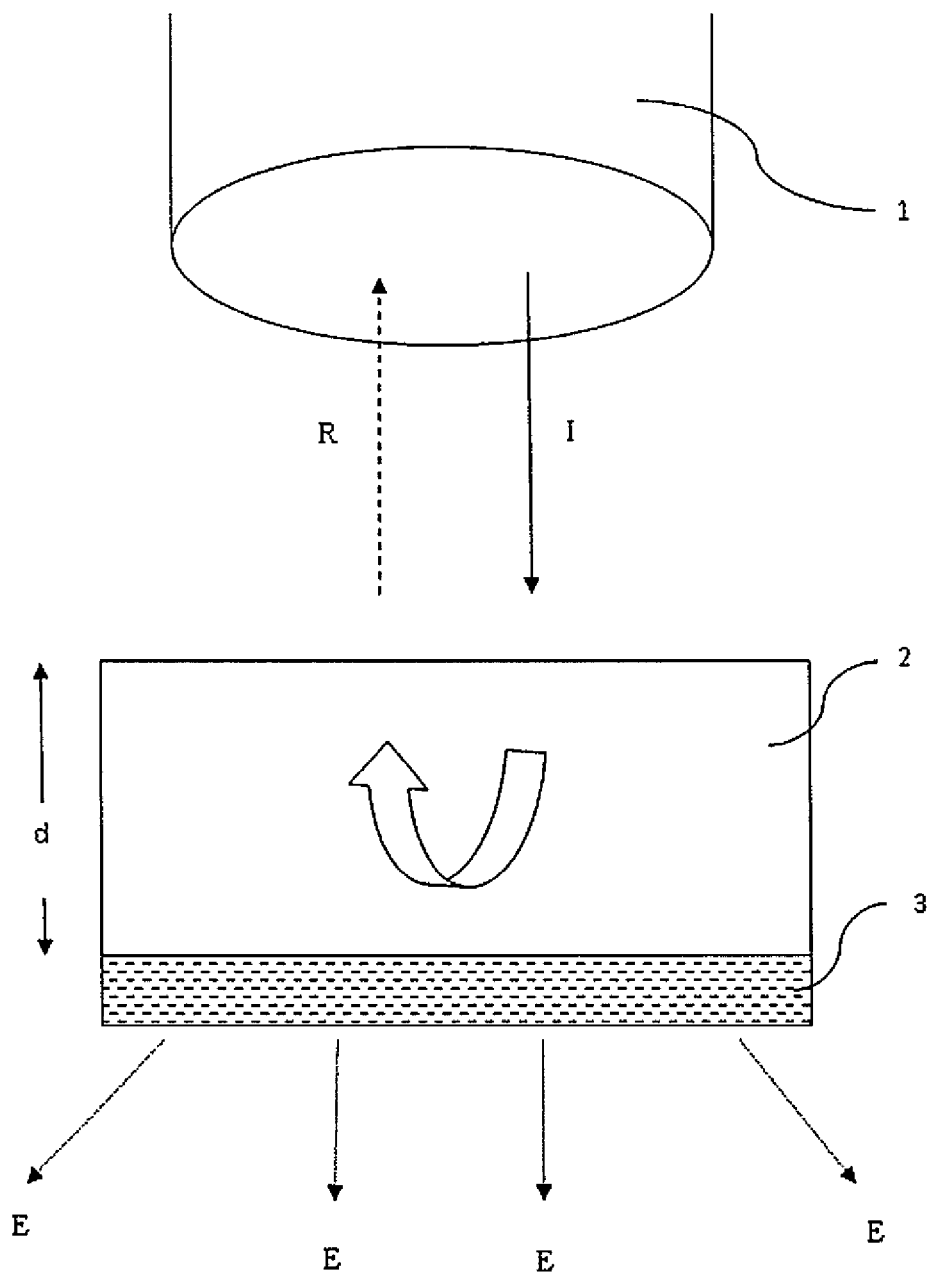
FIG. 2 illustrates the illumination scheme of a second embodiment of a lighting device in accordance with the invention.

FIG. 2 shows a second example, in which a single monochromatic light beam 1 is arranged to provide excitation light to a first surface of the thin phosphor slab 2. The incident beam I is partially reflected R and partially transmitted through the phosphor. The transmitted portion of the beam is incident on the surface of a dichroic mirror 3 arranged on a second surface of the thin phosphor slab 2, opposite the first surface. The dichroic mirror 3 is specifically selected to operate only at the wavelength of the incident beam I transmitted through the phosphor. Transmitted light reflected at the dichroic mirror has substantially the same effect as the second, incident monochromatic light source in the embodiment of FIG. 1. Subject to a suitable value of the phosphor thickness d being chosen, an appropriate phase difference can be introduced and destructive interference between the reflected transmitted beams from the dichroic mirror 3 and reflected beam R from the first surface of the thin phosphor slab 2 is achieved.

Figure 3:
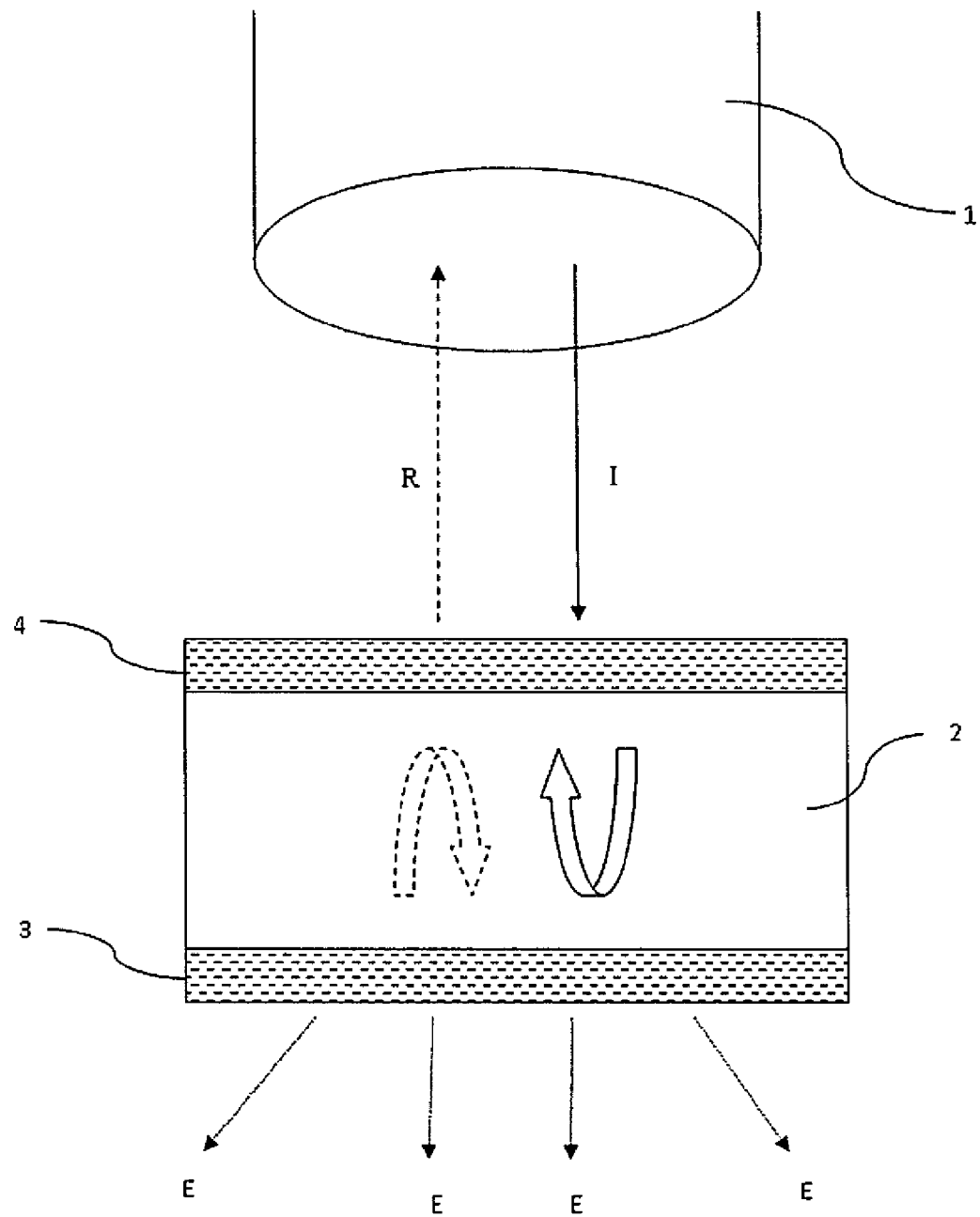
FIG. 3 illustrates the illumination scheme of a third embodiment of a lighting device in accordance with the invention.

FIG. 3 shows a third example, which is substantially the same as that of FIG. 2 but with the inclusion of a second dichroic mirror 4. This second dichroic mirror 4 is specifically selected to operate only at the wavelength of light E emitted by the phosphor.

It will be appreciated that the phosphor does not emit light uni-directionally. The second dichroic mirror reflects emitted light E which is emitted in directions where emission is undesirable or not needed. Consequently, the intensity of emitted light E can be increased in a selected direction.

The lighting device of the invention makes use of a process known as coherent perfect absorption. The theoretical conditions for coherent perfect absorption (CPA) in the case of two counter propagating and co-linear beams impinging at normal incidence on a slab in air are known and explained in detail in the Article "Coherent Perfect Absorbers: Time-Reversed Lasers"; Physical Review Letters, 105, 053901 (2010); authored by Y. D. Chong, L. Ge, H. Cao and A. Douglas Stone.

The process enables a cavity to be made to completely absorb incident light. Coherent perfect absorption occurs when the incident light irradiates the cavity in a particular way. Coherent perfect absorption may be achieved by fabricating a cavity medium with a specified complex index of refraction nm and irradiating the cavity in an appropriate, calculable manner.

The coherent perfect absorption process arises from the interplay of interference and absorption. As discussed above, in the two-channel system of FIG. 1, the reflected part of the first incident beam interferes destructively with the transmitted part of the second incident beam and vice versa. In the presence of specific amounts of dissipation, there exist interference patterns that trap the incident light in the absorbing layer.

This invention is based on the application of this theory to lighting applications, and in particular to improve power efficiency by addressing the problem of the quantum deficit discussed above.

As explained in the Article "Coherent Perfect Absorbers: Time-Reversed Lasers", a relationship exists between the wavelength and thickness of the absorber. This can be used to design the system parameters to achieve CPA.

A detailed example will now be provided, based on a phosphor slab comprising a 110 microns-thick slab of Lumiramic™ (YAG with cerium doping at 3.3%). The operation of the system has been tested with this phosphor slab design and the results presented below are based on this analysis. The Lumiramic slab is polished by a chemical-mechanical procedure on both sides. The thickness of the sample was then measured by a Heidenhain VRZ thickness gauge device. The surface has been characterized through optical microscopy and AFM (atomic force microscopy). The skilled addressee will understand that the principles described can be applied to other known phosphors and phosphor light-source combinations and will have the capacity to do so without the need for further inventive thought.

The configuration of the device which has been tested is substantially as shown and described in relation to FIG. 1. This example is not intended to be limiting for all embodiments of the invention.

An ideal system such as the one shown in FIG. 1 can be described as a three layer system with perfectly planar and parallel interfaces: a layer of thickness d and complex refractive index n embedded in two semi-infinite media of refractive index no. Using this information it is possible to calculate analytically the wavelength at which CPA will take place for this system. As demonstrated in the reference Y. D. Chong, Li Ge, Hui Cao, "Coherent perfect absorbers: time-reversed lasers, Phys. Rev. Lett., 105, 053901 (2010), the equation which needs to be solved is obtained by setting to zero the eigenvalues of the scattering matrix of the system:

$$t \pm r = 0 \qquad \text{Eq. (1)}$$

r and t are the reflection and transmission coefficients, respectively, of the three layer system. This results in:

$$e^{inkd} = \pm \frac{n - n_0}{n + n_0} \quad \text{Eq. (2)}$$

In Eq. 2 n is the refractive index of the phosphor slab, k is the wave vector of the light in the surrounding material of refractive index $n_0$, d is the thickness of the phosphor slab and i is the imaginary unit.

In the case under investigation, $n_0=1$ because the layer is embedded in air.

For every fixed wavelength and thickness and for weakly absorbing layers Eq. (2) can be approximately solved as a function of the complex refractive index. Therefore Eq. (2) defines a curve in the complex plane defined by the real and imaginary components of the refractive index.

Figure 4:
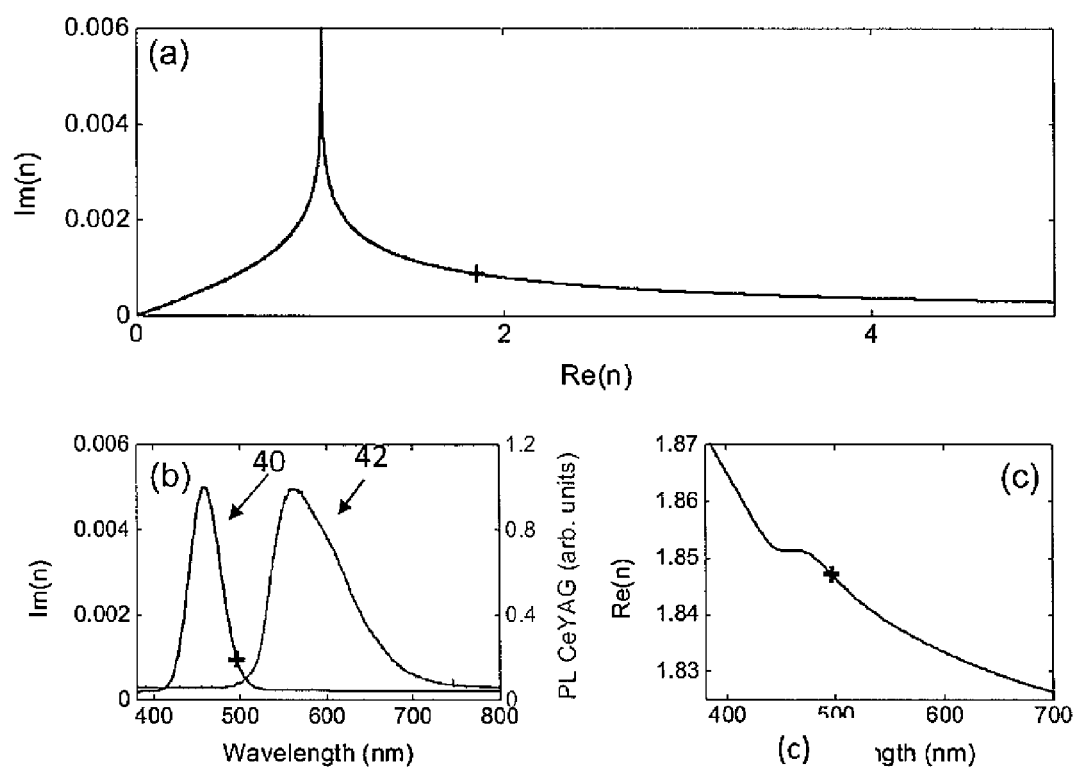
FIG. 4 illustrates optical characteristics considered in achieving total absorption of incident light in a specific embodiment of a lighting device in accordance with the invention.

FIG. 4 (a) shows with a continuous black line the result of the calculation for the wavelengths of $\lambda_{CPA}$=496 nm and for a layer thickness of 110 microns. For this fixed wavelength $\lambda_{CPA}$, each point on the black line in FIG. 4(a) describes a different material. The cross on this figure corresponds to the real and imaginary refractive index of CeYAG at 496 nm. The overlap of the cross with the solid line indicates that for a slab of 110 microns of CeYAG the CPA condition can be achieved at $\lambda_{CPA}$=496 nm.

FIG. 4(b) shows the imaginary component 40 of the phosphor layer refractive index as a function of wavelength and also shows a typical emission spectrum 42 for CeYAG. The maximum phosphor layer absorption is found at 460 nm.

FIG. 4(c) shows the real component of the phosphor layer refractive index as a function of wavelength.

These measurements are taken using ellipsometry for deriving the complex refractive index values. The crosses in FIGS. 4(b) and (c) show the refractive index of the CeYAG slab at $\lambda_{CPA}$=496 nm.

FIG. 4(b) shows that the $\lambda_{CPA}$ for the sample CeYAG slab is reached at a wavelength longer than the wavelength of maximum absorption ($\lambda_{max}$=460 nm) of CeYAG, i.e., at a wavelength where the absorption of CeYAG is low. By taking advantage of the CPA condition the absorption at 496 nm can be even higher than at 460 nm, while the quantum deficit is reduced by 36% when exciting the emission at 496 nm.

The absorption can be modulated from 100% to a minimum by acting on the relative phase, $\phi$, between the two incident beams. The photoluminescence (PL) will have the same modulation if the illumination intensity is sufficiently low to avoid non-linear phenomena.

The photoluminescence modulation can be determined by calculating the modulation of the absorption. With equal intensities to 1 in each of the beams, the absorption as a function of $\phi$ at the wavelength $\lambda_{CPA}$ is given by $$I(\lambda_{CPA}, \phi) = 2 - I_0(\lambda_{CPA})\cos^2\left(\frac{\phi}{2}\right), \quad \text{Eq. (3)}$$

where $$I_0(\lambda_{CPA}) = \left| \frac{(n(\lambda_{CPA}))^2 - n_0^2}{(n(\lambda_{CPA}))^2 + n_0^2} \right|^2$$

This calculation assumes ideally flat and parallel interfaces. Therefore, the absorptance can be modulated between 100% and a minimum given by $I_0$. The higher the refractive index contrast between the slab and the surrounding medium, the higher is the modulation that can be achieved. The initial phase difference is taken equal to 0, without loss of generality. In the case under analysis, the predicted modulation of the intensity is given by:

$$\frac{I(\lambda_{CPA}, \phi = 0) - I(\lambda_{CPA}, \phi = \pi)}{(I(\lambda_{CPA}, \phi = 0) + I(\lambda_{CPA}, \phi = \pi))/2}$$

and has a value of 23.5%.

Figure 5:
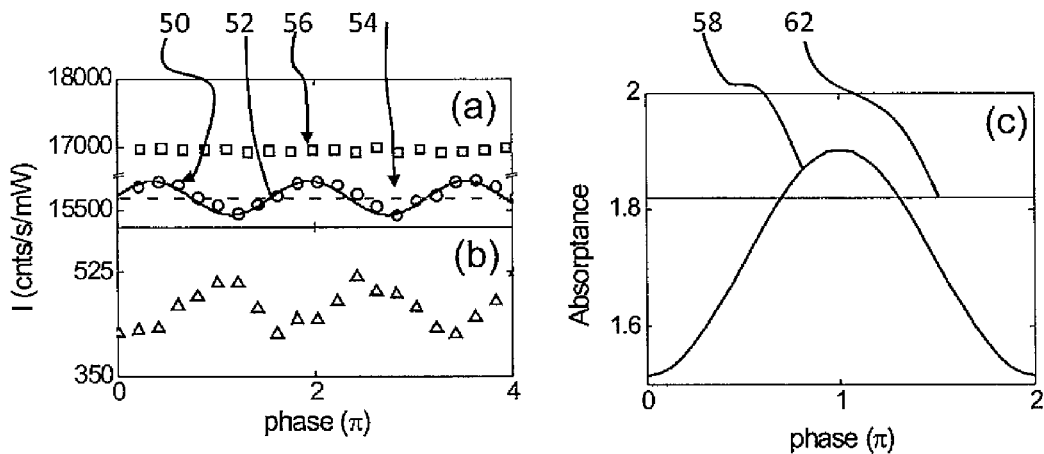
FIG. 5 shows various functions to explain modulation of the photoluminance from phosphor layer when operating at the wavelength for CPA.

FIG. 5 shows the measured modulation of the photo luminescence from the CeYAG layer. The light source used to pump the phosphor is an Ar—Kr laser generating a wavelength $\lambda_{exp}$=495.9 nm, which is very close to the calculated $\lambda_{CPA}$.

FIG. 5(a) shows measurements 50 of the modulation of the maximum of the photoluminescence as a function of the phase difference cp between the two incident beams, for the incident wavelength $\lambda_{exp}$=495.9 nm. The experimental modulation is equal to 2.3%. The continuous line 52 shows a fit of those measurements with a cosine square type function, which confirms that the origin of the modulation is the interference. The dashed line 54 indicates the sum of the maxima of the photoluminescence with the two beams separately (phase uncorrelated) impinging on the sample. Plot 56 shows the measured photoluminescence for an incident laser wavelength of 457 nm, which is very close to $\lambda_{max}$. This is presented for the purpose of comparison and it represents the wavelength conventionally used to achieve maximum absorption and emission.

There is large difference of a factor 10 between experimental modulation ($\lambda_{exp}$=2.3%) and theoretical prediction ($M_{calc}$=23.5%). The theoretical result predicated by Eq. (3) is valid only for the exact single wavelength $\lambda_{CPA}$ and for perfectly plane-parallel and smooth interfaces. The light source used to pump the phosphor is an Ar—Kr laser, which makes use of an atomic transition to generate $\lambda_{exp}$=495.9 nm laser light. We therefore consider this line to be sharp enough to fulfill the condition assumed in the theory.

Under the optical microscope, scatterers on the surface of the sample which have dimensions allowing efficient scattering of the pump light are visible. These visible scatterers are residual products of the chemical polishing which etches at different rates the edges of the crystals composing the YAG:Ce. The dimensions of the scatterers are on the order of few microns. In the region where no scatterers are present the roughness of the surface, determined by AFM, results in a measurement of 35 nm. The surface roughness therefore constitutes the main source of discrepancy between the experiment and the calculation. By performing a higher quality mechanical polishing and by avoiding the chemical polishing the roughness can be drastically reduced. In this way, the formation of the scatterers can be avoided making the sample closer to the conditions assumed by the CPA theory.

Simultaneously to the measurement of the spectra, the total intensity from one side of the sample was recorded with a camera. FIG. 5(b) shows measurements of the far field intensity. In FIG. 5(b), each point is the result of the average over the full width at half maximum of the intensity of each beam spot in the camera. The intensity is the result of the interference between the transmitted part of one beam and the reflected part of the other beam. It is therefore expected to be in anti-phase with respect to the photoluminescence modulation: when the interference pattern built outside the layer is destructive (the minima in FIG. 5(b)), the energy is trapped into the layer and eventually converted into photoluminescence (the maxima in the photoluminescence modulation in FIG. 5(a)).

In general (for any wavelength), the absorptance of the 3-layer system can be analytically calculated with the transfer matrix method and the superposition principle. This approach allows calculating the response of the system also for wavelengths different than $\lambda_{CPA}$. First, the complex reflection and transmission coefficients of the three layer system are calculated for the single beam illumination and taking into account the travelling direction of the light. From these, the spatial distribution of the complex electric field in the system is evaluated. These steps are carried out for the two counter propagating beams separately. Then at each position the complex electric fields associated with the two beams are added. The absorptance in the layer is then evaluated through the integral of the modulus square of the total electric field. In CPA condition this calculation gives the same result of Eq. 3.

In FIG. 5(c), the continuous line 58 shows a calculation of the absorptance as a function of the phase difference between the two beams for an incident wavelength of $\lambda_{exp}$=495.9 nm. The resulting absorptance slightly differs from the one predicted by Eq. (3) (not shown) because of the small difference between $\lambda_{CPA}$ and $\lambda_{exp}$. Line 62 in FIG. 5(c) shows the calculated absorptance for an incident wavelength of 457 nm (close to $\lambda_{max}$). For this wavelength (far from the CPA condition) the absorptance is nearly two times the one of the single beam. For $\lambda_{exp}$=495.9 nm, a higher absorptance is reached compared to the absorptance obtained at 457 nm (close to $\lambda_{max}$), which means that CPA is beneficial not only to reduce the quantum deficit but also to reach the maximum absorptance and amount of photoluminescence that a given sample can generate.

Figure 6:
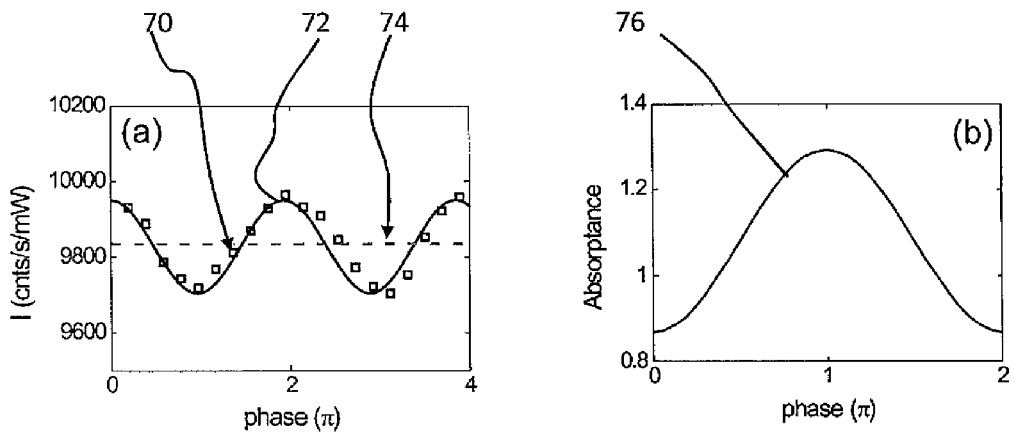
FIG. 6 shows various functions to explain modulation of the photoluminance from phosphor layer when operating not at the wavelength for CPA.

To further reduce the quantum deficit and to demonstrate that coherent control and modulation of light emission is possible also for $\lambda \neq \lambda_{CPA}$, a measurement of the photo luminance as a function of φ for the incident wavelength λ=514 nm is shown in FIG. 6(a).

The measured values are shown as plot 70, and the continuous line 72 is the fit of the measured photoluminescence with a cosine square function. The dashed line 74 indicates the sum of the maxima of the photoluminescence when the two beams impinge separately on the sample. The experimental modulation of the photoluminescence is 2.5%.

In FIG. 6(b), the continuous line 76 is the calculated absorptance for the wavelength of 514 nm as a function of φ. The discrepancy with the theory can be explained by the surface roughness similarly to the case of $\lambda_{CPA}$.

The plot for measurements at 514 nm demonstrates that it is possible to modulate the photoluminescence outside of the condition for CPA. As predicted, the intensity of the photoluminescence for the wavelength of the perfect absorption (496 nm) is higher than for 514 nm.

The CPA is also helpful to keep the thickness of the emitting material low. Indeed the condition for CPA at 514 nm imposes a thickness of the YAG:Ce of 300 microns with which 100% absorptance is reached, while the maximum absorptance at this wavelength with a single beam illumination is 90% (the reflection at the first interface cannot be cancelled) and requires a thickness higher than 500 microns.

The detailed analysis above is based on the arrangement of FIG. 1, with two counter-propagating excitation light beams. For the systems of FIGS. 2 and 3, the analysis is less complicated, and involves calculating the reflection coefficient for the three layer system of FIG. 2 (air-phosphor-mirror) or the four layer system of FIG. 3 (air-mirror-phosphor-mirror), and set this reflection coefficient to zero. The analytical expressions for these quantities are basic knowledge in optics.

For an intuitive description of how the systems operate, reference is made to W. Wan, Y. Chong; L. Ge; H. Noh; A. D. Stone; H. Cao; Time Reversed Lasing and Interferometric Control of Absorption, Science, 2011, 331, 889-892.

In conclusion, the invention is based on external control and modulation of the intensity of the light emitted by a thin layer of YAG:Ce. The principle has been demonstrated, based on the use of two counter-propagating beams illuminating the sample, which create a destructive interference pattern outside the sample layer. The pump light is trapped in the phosphor layer where it is eventually absorbed and efficiently converted. The CPA allows for the total absorption of the incident light by thin layers and therefore establishes the upper limit for the amount of light generated by a given emitting sample. The CPA applied to light emission allows also for a quantum deficit reduction, which represents a fundamental factor in the power efficiency of any phosphor-converted light-emitting device. In the example system, 36% reduction has been obtained. The invention enables full down-conversion to be obtained with a reduction in material.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A lighting device, comprising:
   a phosphor layer; and
   a light source arrangement arranged to pump or photo excite the phosphor layer wherein the light source arrangement is configured to provide two monochromatic light beams that counter propagate within the phosphor layer thereby providing destructive interference of the light outside the phosphor layer,
   wherein the phosphor layer has an absorption spectrum with respect to a wavelength having a peak absorption at a first wavelength, and wherein a light source of the light source arrangement arranged to pump or photo excite the phosphor layer has a peak output of a second wavelength larger than the first wavelength,
   wherein the phosphor layer is configured to convert absorbed incident light from the light source arrangement into photoluminescence.

2. The lighting device as claimed in claim 1, wherein the material of the phosphor layer, the thickness of the phosphor layer and the excitation wavelength are selected to achieve coherent absorption of the output of the light source arrangement.

3. The lighting device as claimed in claim 1, wherein the light source arrangement generates first and second beams of equal intensity and wavelength, and the light source arrangement is for directing the first and second beams normally into the phosphor layer from opposite sides of the phosphor layer to counter propagate within the phosphor layer.

4. The lighting device as claimed in claim 3, wherein the device comprises a positioning device for adjusting the linear positioning of one of the counter propagating beams with respect to the other thereby to control the phase of the one of the counter propagating beams.

5. The lighting device as claimed in claim 4 wherein the positioning device is a piezo electric actuator or a spatial light modulator.

6. The lighting device as claimed in claim 1, wherein the light source arrangement generates a single beam, and the two monochromatic light beams that counter propagate within the phosphor layer are provided by a dichroic mirror at an opposite side of the phosphor layer to the side into which the single beam is introduced.

7. The lighting device as claimed in claim 6, wherein the dichroic mirror is for reflecting light of the wavelength of the output of the light source arrangement.

8. The lighting device as claimed in claim 6, further comprising a second dichroic mirror provided at the side of the phosphor layer into which the single beam is introduced, the second dichroic mirror being for reflecting light of the wavelength of the light output of the phosphor layer.

9. The lighting device as claimed in claim 1 further comprising a tuner for adjusting the wavelength of the light source arrangement.

10. The lighting device as claimed in claim 1 further comprising a controller for controlling the angle of incidence of the light source arrangement output into the phosphor layer.

11. The lighting device as claimed in claim 1 wherein the light source arrangement is a laser diode.

12. A method for generating a light output, comprising:
generating a light output having an excitation wavelength;
introducing the light output having the excitation wavelength into a phosphor layer to pump or photo excite the phosphor layer; and
providing two monochromatic light beams that counter propagate within the phosphor layer thereby providing destructive interference of the light output outside the phosphor layer, wherein the phosphor layer has an absorption spectrum with respect to a wavelength having a peak absorption at a first wavelength, and the excitation wavelength of the light output has a peak output of a wavelength greater than the first wavelength,
wherein the phosphor layer is configured to convert absorbed incident light from the light source arrangement into photoluminescence.

13. The method as claimed in claim 12, comprising selecting the material of the phosphor layer, the thickness of the phosphor layer and the excitation wavelength to achieve coherent perfect absorption of the light output.

14. The method as claimed in claim 12, comprising:
generating first and second beams of equal intensity and wavelength, and directing the first and second beams to counter propagate within the phosphor layer.

15. The method as claimed in claim 12, comprising:
generating a single beam, and providing reflection using a dichroic mirror at an opposite side of the phosphor layer to the side into which the single beam is introduced.

* * * * *